US009147791B1

(12) United States Patent
Park et al.

(10) Patent No.: US 9,147,791 B1
(45) Date of Patent: Sep. 29, 2015

(54) METHOD FOR FABRICATION PATTERN OF NANO MATERIAL

(71) Applicant: INHA-INDUSTRY PARTNERSHIP INSTITUTE, Incheon (KR)

(72) Inventors: Se-Geun Park, Seoul (KR); Jin-Kyun Lee, Incheon (KR); Myung-Soo Kim, Gyeonggi-do (KR); Jung Seokheon, Incheon (KR)

(73) Assignee: INHA-Industry Partnership Institute, Incheon (KR)

( * ) Notice: Subject to any disclaimer, the term of this patent is extended or adjusted under 35 U.S.C. 154(b) by 0 days.

(21) Appl. No.: 14/482,076

(22) Filed: Sep. 10, 2014

(30) Foreign Application Priority Data

Mar. 19, 2014 (KR) .......................... 10-2014-0032052
Jun. 24, 2014 (KR) .......................... 10-2014-0077598
Jun. 24, 2014 (KR) .......................... 10-2014-0077599

(51) Int. Cl.
*H01L 21/4763* (2006.01)
*H01L 31/18* (2006.01)
*H01L 51/44* (2006.01)

(52) U.S. Cl.
CPC ................ *H01L 31/18* (2013.01); *H01L 51/44* (2013.01)

(58) Field of Classification Search
CPC ............ H01L 31/18; H01L 31/022466; H01L 31/0224; H01L 51/00; H01L 51/44
USPC ........................................................ 438/637
See application file for complete search history.

(56) References Cited

U.S. PATENT DOCUMENTS

2004/0036130 A1 * 2/2004 Lee et al. ...................... 257/409

FOREIGN PATENT DOCUMENTS

| EP | 0 943 158 B1 * | 1/2005 | ............. H01L 25/16 |
| KR | 10-201348717 | 5/2013 | |
| KR | 10-1357179 | 1/2014 | |

OTHER PUBLICATIONS

Madaria et al. "Uniform, Highly Conductive, and Patterned Transparent Films of a Percolating Silver Nanowire Network on Rigid and Flexible Substrates Using a Dry Transfer Technique", Nano Res (2010) 3: 564-573.
Akter et al. "Reversibly Stretchable Transparent Conductive Coatings of Spray-Deposited Silver Nanowires", ACS Applied Materials & Interfaces, 2012, 4, 1855-1859.

* cited by examiner

*Primary Examiner* — David S Blum
(74) *Attorney, Agent, or Firm* — Sheridan Ross P.C.

(57) ABSTRACT

The present invention provides a method for fabricating nano material pattern comprising the steps of forming a perfluorinated polymer pattern on top of the substrate (step 1); spreading a dispersion containing the dispersed nano material on the substrate patterned in step 1) (step 2); and eliminating the perfluorinated polymer pattern formed on the substrate of step 2) (step 3). The method for fabricating nano material pattern of the present invention has advantages over the conventional lift-off method for the fabrication of nano material pattern, which are easiness in eliminating the perfluorinated polymer pattern after forming the nano material pattern with it and no chance of damaging the substrate, suggesting that the method of the invention is excellent in fabricating an excellent nano material pattern.

22 Claims, 11 Drawing Sheets

METHOD FOR FABRICATION PATTERN OF NANO MATERIAL

CROSS-REFERENCES TO RELATED APPLICATION

This application claims the benefit of priority from Korean Patent Application No. 10-2014-0032052, filed on Mar. 19, 2014, in the Korean Intellectual Property Office, Korean Patent Application No. 10-2014-0077598, filed on Jun. 24, 2014, in the Korean Intellectual Property Office and Korean Patent Application No. 10-2014-0077599, filed on Jun. 24, 2014, in the Korean Intellectual Property Office the contents of which are incorporated herein by reference in its entirety.

BACKGROUND OF THE INVENTION

1. Field of the Invention

The present invention relates to a method for fabricating nano material pattern.

2. Description of the Related Art

Indium tin oxide (ITO), one of the representative transparent electrode materials, has been widely applied to a variety of devices including liquid crystal display, organic light emitting display, touch screen, electroluminescent device, and photoelectric cell, etc. As the area of flat display gets larger, sheet resistance becomes a problem of the conventional ITO applied thereto. When ITO is applied to flexible display, cracks happen to be developed, which limits the use of ITO.

To overcome the above problem, an alternative for ITO such as metal nano wire, carbon nano tube, graphene, and conducting polymer has been tried and a technique to use a metal thin film with a mesh pattern is under development.

Such materials as metal nano wire, carbon nano tube, and graphene are used as the form of dispersion which can be prepared by dispersing the said material in a specific solvent, in order to make a film. At this time, the method for fabrication of a pattern based on such dispersion is limited.

The conventional method for fabrication of a specific material pattern based on dispersion is composed of the following processes: spraying the dispersion to a material for coating; and etching the coated material to form a pattern. For example, Korean Patent Publication No. 10-2013-0048717 describes the nanowire-based transparent conductors and methods of patterning same. Particularly, that invention is related to the partial etching to form low-visible or invisible patterns.

There is another invention related to the method for preparing nano wire comprising the steps of oxidizing copper nano wire by laser irradiation; and reducing the oxidized copper nano wire to generate the sintered nano wire, and the method for fabrication of nano wire pattern (Korean Patent No. 10-1357179). The method comprising the steps of coating patterned mold with silver nano wire and directly transcribing the coated silver nano wire on the substrate has also been reported (Nano. Res., 3, 564, 2010). Another example is the method for fabrication of a pattern by treating the substrate partially with dopamine to increase hydrophilicity (ACS Appl. Mater. Interfaces., 4, 1855, 2012).

The most common method used in the semiconductor manufacturing process, so called 'lift-off', is characterized by the steps of forming a photoresist pattern on a substrate via photolithography; and then eliminating the photoresist by coating the substrate with a material requiring fabrication. However, the dispersion can hardly be used in the next procedure. The disadvantages of the method are firstly difficulty in photoresist patterning on an organic substrate and secondly elimination of the photoresist pattern by a specific solvent used as the dispersion (for example, IPA, ethanol, etc). Even if the photoresist pattern is not eliminated somehow, nano material such as nano wire can be separated by a solvent such as acetone during the elimination process of photoresist pattern, which is also a problem.

Therefore, when fabricating a material in a dispersion is induced according to the method of lift-off, it is not supposed for the dispersion solvent to eliminate a polymer pattern formed on an organic substrate and it is not supposed for the polymer pattern to react with nano material like nano wire in order to prevent the nano material from being off from the substrate. The solvent that eliminates the patterned polymer should not affect the organic substrate.

In the course of studying a method for fabricating nano material pattern that can satisfy the above conditions, the present inventors succeeded in forming a polymer pattern by applying perfluorinated polymer on a substrate and accordingly developed a method for fabricating nano material pattern by using the dispersion prepared by spraying nano material on the formed polymer pattern, leading to the completion of this invention.

SUMMARY OF THE INVENTION

It is an object of the present invention to provide a method for fabricating nano material pattern.

To achieve the above object, the present invention provides a method for fabricating nano material pattern comprising the following steps:

forming a perfluorinated polymer pattern on top of the substrate (step 1);

spreading a dispersion containing the dispersed nano material on the substrate patterned in step 1) (step 2); and eliminating the perfluorinated polymer pattern formed on the substrate of step 2) (step 3).

The present invention also provides a method for fabricating nano material pattern comprising the following steps:

forming a perfluorinated polymer pattern on top of the substrate (step 1);

spreading a dispersion containing the dispersed nano material and a functional material on the substrate patterned in step 1) (step 2); and eliminating the perfluorinated polymer pattern formed on the substrate of step 2) (step 3).

In addition, the present invention provides a method for fabricating nano material pattern comprising the following steps:

forming a perfluorinated polymer pattern on top of the substrate (step 1);

spreading a dispersion containing the dispersed nano material on the substrate patterned in step 1) (step 2)

eliminating the perfluorinated polymer pattern formed on the substrate of step 2) (step 3); and inserting the nano material pattern formed by eliminating the perfluorinated polymer pattern in step 3 into the inside of the substrate (step 4).

Advantageous Effect

As explained hereinbefore, the method for fabricating nano material pattern of the present invention makes the elimination of a perfluorinated polymer pattern easy after forming the nano material pattern by using a perfluorinated polymer according to the conventional lift-off and also makes the fabrication of an excellent nano material pattern easy without damaging the substrate or the nano material.

BRIEF DESCRIPTION OF THE DRAWINGS

The application of the preferred embodiments of the present invention is best understood with reference to the accompanying drawings, wherein.

DESCRIPTION OF THE PREFERRED EMBODIMENTS

Figure 1:
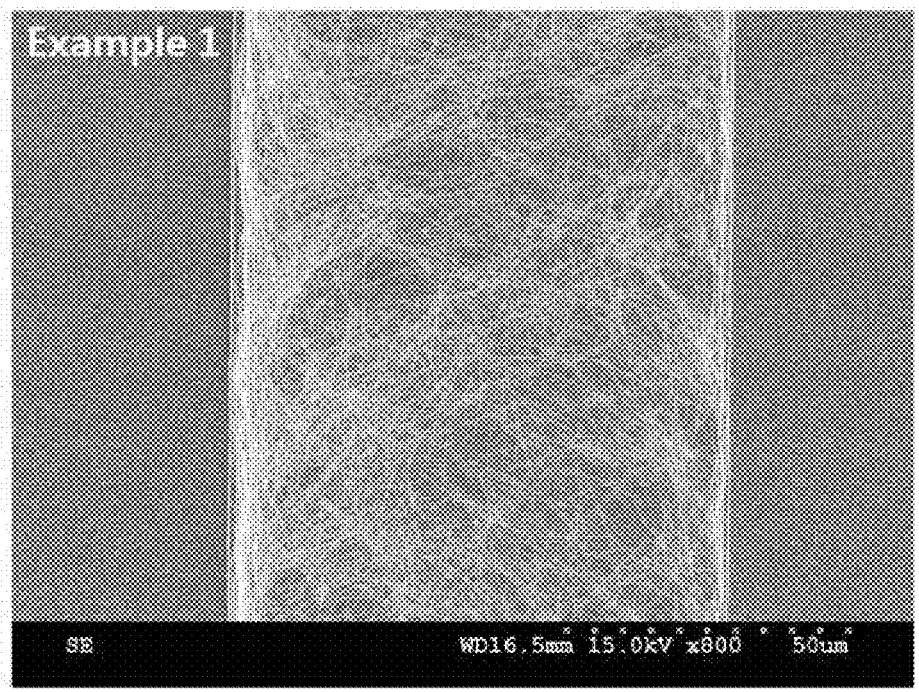
FIG. 1~FIG. 5 are photographs of the nano material patterns fabricated in example 1~example 5 of the present invention, observed under scanning electron microscope (SEM)
Figure 2:
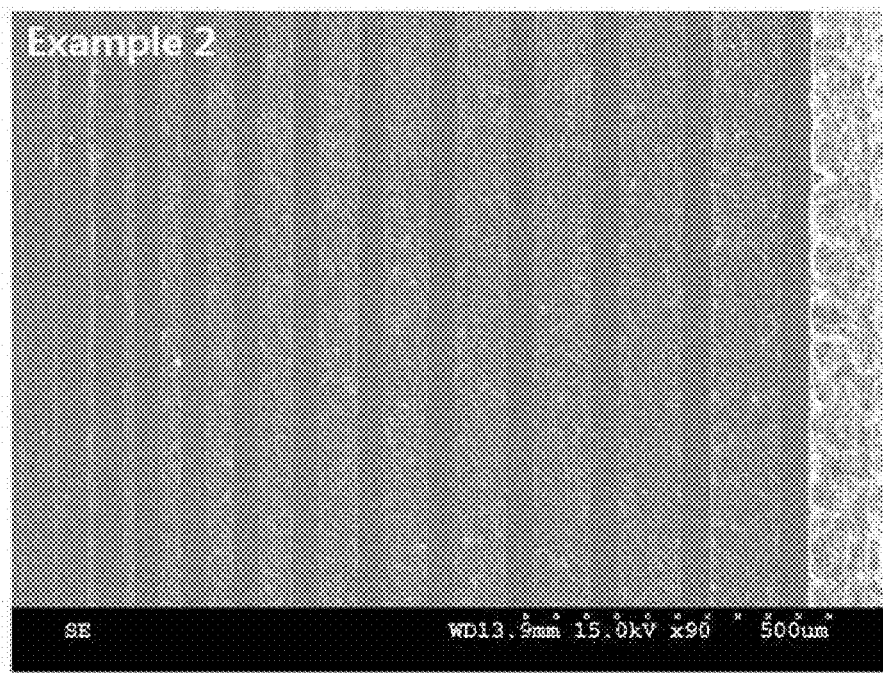
Figure 3:
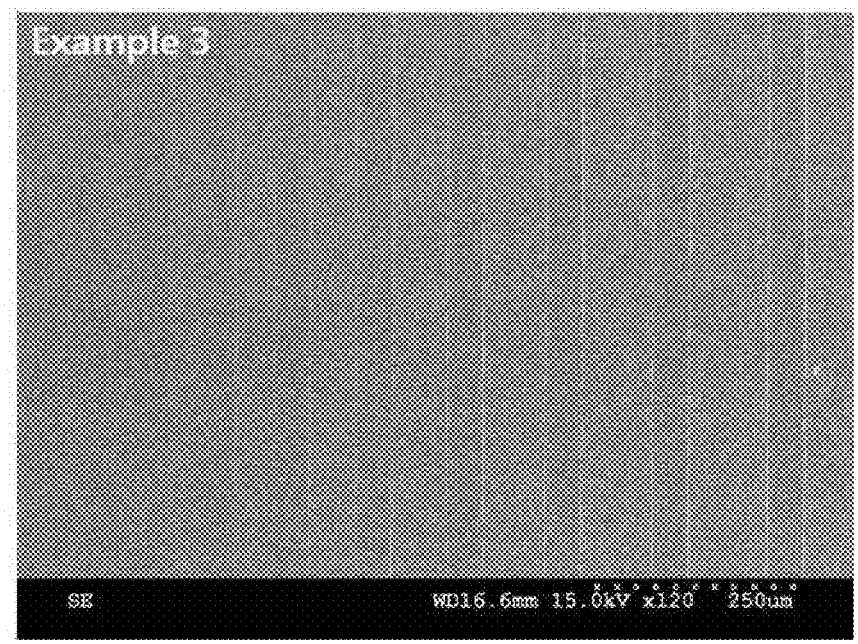
Figure 4:
Figure 5:
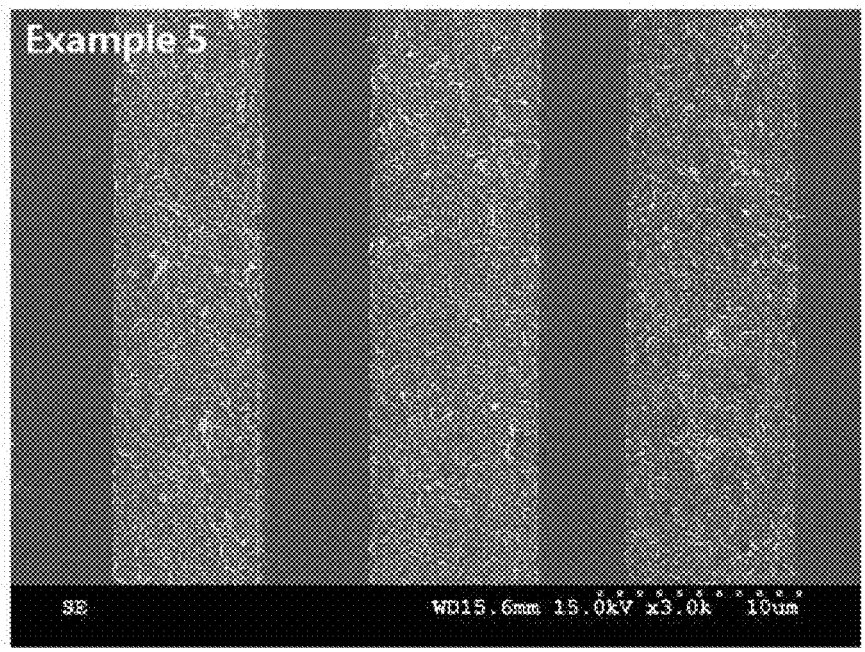

The present invention provides a method for fabricating nano material pattern comprising the following steps:

forming a perfluorinated polymer pattern on top of a substrate (step 1);

spreading a dispersion containing the dispersed nano material on the substrate patterned in step 1) (step 2); and eliminating the perfluorinated polymer pattern formed on the substrate of step 2) (step 3).

Hereinafter, the method for fabricating nano material pattern of the present invention is described in more detail, step by step.

In the method for fabricating nano material pattern of the present invention, step 1) is to form a perfluorinated polymer pattern on top of a substrate.

In step 1), the perfluorinated polymer pattern is formed on top of a generally used substrate.

Particularly, the perfluorinated polymer of step 1) is a homopolymer or a copolymer containing poly(perfluoroalkyl methacrylate) or poly(perfluoroalkyl acrylate). At this time, alkyl of the poly(perfluoroalkyl methacrylate) or poly(perfluoroalkyl acrylate) is $C_3$-$C_{20}$ straight chain or branched chain alkyl, and more preferably $C_6$-$C_{12}$ straight chain or branched chain alkyl. The said polymer can contain at least 6 fluoro groups (—F). It also can be a copolymer having solubility with a perfluorinated solvent obtained by copolymerization between a proper amount of a non-fluorinated monomer with poly(perfluoroalkyl methacrylate), or a commercialized amorphous polymer material such as CYTOP, TEFLOON AF, etc. For example, it can be poly(1H,1H,2H,2H-Perfluorodecyl methacrylate (PFDMA).

The substrate of step 1) can be any substrate as long as it has excellent adhesiveness with the perfluorinated polymer, but is preferably exemplified by silicone substrate, glass substrate, poly methyl methacrylate (PMMA) substrate, poly vinyl pirrolidone (PVP) substrate, polystyrene (PS) substrate, polycarbonate (PC) substrate, polyethersulfone (PES) substrate, cyclic olefin copolymer (COC) substrate, TAC (triacetylcellulose) substrate, polyvinyl alcohol substrate, polyimide (PI) substrate, polyethyleneterephthalate (PET) substrate, and polyethylenenaphthalate (PEN) substrate, etc.

Further, the method to form the pattern of step 1) is selected from the group consisting of microcontact printing, photolithography, imprint method, inkjet printing, and dispensing, but not always limited thereto.

At this time, the method to form the pattern of step 1) can be composed of the following steps:

preparing a polymer mold in which a convex part and a concave part are formed (step a);

preparing a polymer solution containing a perfluorinated polymer (step b);

forming a polymer layer on the surface of the convex part of the polymer mold by spreading the polymer solution prepared in step b) on the polymer mold prepared in step a) (step c); and transcribing the polymer layer formed on the surface of the convex part of the polymer mold by contacting the polymer mold having the polymer layer formed in step c) with the substrate (step d).

Particularly, step a) is to prepare a polymer mold in which a convex part and a concave part are formed.

More specifically, step a) is to prepare a polymer mold with a convex part and a concave part formed therein in order to create a wanted pattern. At this time, the polymer mold can be prepared by using a proper template and the gap between the convex part and the concave part, and width and depth of them can be regulated to make a wanted pattern of the polymer mold.

The preparation of the polymer mold of step a) is also accomplished by spreading a polymer on the master, the template with pattern formed therein. At this time, in the pattern of the polymer mold, lines are evenly formed at the intervals of 0.5~50 μm in the thickness of 0.1~10 μm. The height of the line is 0.1~10 μm, but not always limited thereto, and in fact the polymer mold can have a variety of patterns according to the patterns of the master, the template.

Further, the polymer mold of step a) can be hard-polydimethylsiloxane (h-PDMS) mold or soft-polydimethylsiloxane (s-PDMS) mold, but hard-polydimethylsiloxane mold is more preferred.

Next, step b) is to prepare a polymer solution containing the perfluorinated polymer.

Particularly, step b) is to prepare a polymer solution to form a polymer layer on the mold prepared in step a) by dissolving the perfluorinated polymer in a solvent.

At this time, the polymer solution of step b) can include a fluoro solvent, and the fluoro solvent can be hydrofluoroether (HFE), hydrofluorocarbon, perfluorocarbon, and highly fluorinated aromatic solvent, but any solvent that can dissolve the perfluorinated polymer can be used without limitation.

The concentration of the perfluorinated polymer of step b) is preferably 1~50 weight % by the total weight of the polymer solution. If the concentration of the perfluorinated polymer of step b) is less than 1 weight % by the total weight of the polymer solution, it is difficult to spread the polymer solution on the polymer mold to form a polymer layer, more precisely difficult to form a polymer layer evenly on the surface of the convex part of the polymer mold. It is also difficult with that concentration to use the formed pattern as a mask because the thickness of the formed layer would be several nm. On the other hand, if the concentration is more than 50 weight %, it is difficult to spread it evenly because of the excessive polymer.

Next, step c) is to form a polymer layer on the surface of the convex part of the polymer mold by spreading the polymer solution prepared in step b) on the polymer mold prepared in step a).

Microcontact printing is performed based on the difference of adhesion force among materials (a polymer mold, a polymer to form a pattern, and a substrate). When the difference of adhesion force between a mold and a polymer and between a polymer and a substrate is big, transcription can be successfully accomplished. The said adhesion force is related to surface energy of each material. To change the surface energy, a mold is treated with oxygen plasma or coated with a specific chemical solution. However, in the case of a device requiring an organic substrate, such surface treatment might affect the organic substrate to reduce properties of the device.

The said method facilitates patterning without any additional surface treatment. To do so in this invention, a polymer layer is formed on the surface of the convex part of the polymer mold by using the polymer mold prepared in step a) and the perfluorinated polymer having weak adhesion force.

Particularly, the method for spreading in step c) is not limited to a specific one as long as it can form a polymer layer evenly, but spin coating is preferred. At this time, the spin coating is performed at 500~3,000 rpm for 10~120 seconds.

Next, step d) is to transcribe the polymer layer formed on the surface of the convex part of the polymer mold by contacting the polymer mold with the polymer layer formed thereon with a substrate.

In step d), the polymer mold with the polymer layer composed of the perfluorinated polymer is contacted with a substrate by microcontact printing, that is, a pattern is fabricated by transcribing the polymer layer formed on the surface of the convex part of the polymer mold on a substrate.

The substrate of step d) can be any substrate as long as it has excellent adhesiveness with the perfluorinated polymer, but is preferably exemplified by silicone substrate, glass substrate, poly methyl methacrylate (PMMA) substrate, poly vinyl pirrolidone (PVP) substrate, polystyrene (PS) substrate, polycarbonate (PC) substrate, polyethersulfone (PES) substrate, cyclic olefin copolymer (COC) substrate, TAC (triacetylcellulose) substrate, polyvinyl alcohol substrate, polyimide (PI) substrate, polyethyleneterephthalate (PET) substrate, and polyethylenenaphthalate (PEN) substrate, etc.

At this time, the transcription of the polymer layer in step d) is accomplished by taking advantage of the difference of adhesion force between the polymer mold and the polymer layer and between the polymer layer and the substrate. When the difference of adhesion force between them is big, transcription can be successfully accomplished to fabricate the pattern on the substrate.

The thickness of the polymer pattern formed by the transcription performed in step d) is preferably 50~500 nm. The thickness of the pattern fabricated by the transcription in step d) is the same as the thickness of the polymer layer layered on the surface of the convex part of the polymer mold, which is 50~500 nm.

Further, the method to form the pattern of step 1) is exemplified by another procedure comprising the following steps:
preparing a polymer mold in which a convex part and a concave part are formed (step a);
preparing a polymer solution containing a perfluorinated polymer (step b);
forming a polymer layer in the concave part of the polymer mold by spreading the polymer solution prepared in step b) on the polymer mold prepared in step a) (step c); and
transcribing the polymer layer formed in the concave part of the polymer mold by contacting the polymer mold having the polymer layer formed in step c) with the substrate (step d).

Particularly, step a) is to prepare a polymer mold in which a convex part and a concave part are formed.

More specifically, step a) is to prepare a polymer mold with a convex part and a concave part formed therein in order to create a wanted pattern. At this time, the polymer mold can be prepared by using a proper template and the gap between the convex part and the concave part, and width and depth of them can be regulated to make a wanted pattern of the polymer mold.

The preparation of the polymer mold of step a) can be accomplished by spreading a polymer on the master, the template with pattern formed therein. At this time, in the pattern of the polymer mold, lines are evenly formed at the intervals of 0.5~50 μm in the thickness of 0.1~10 μm. The height of the line is 0.1~10 μm, but not always limited thereto, and in fact the polymer mold can have a variety of patterns according to the patterns of the master, the template.

Further, the polymer mold of step a) can be hard-polydimethylsiloxane (h-PDMS) mold or soft-polydimethylsiloxane (s-PDMS) mold, but hard-polydimethylsiloxane mold is more preferred.

Next, step b) is to prepare a polymer solution containing the perfluorinated polymer.

Particularly, step b) is to prepare a polymer solution to form a polymer layer on the mold prepared in step a) by dissolving the perfluorinated polymer in a solvent.

At this time, the polymer solution of step b) can include a fluoro solvent, and the fluoro solvent can be hydrofluoroether (HFE), hydrofluorocarbon, perfluorocarbon, and highly fluorinated aromatic solvent, but any solvent that can dissolve the perfluorinated polymer can be used without limitation.

The concentration of the perfluorinated polymer of step b) is preferably 1~50 weight % by the total weight of the polymer solution. If the concentration of the perfluorinated polymer of step b) is less than 1 weight % by the total weight of the polymer solution, it is difficult to spread the polymer solution on the polymer mold to form a polymer layer, more precisely difficult to form a polymer layer evenly on the surface of the convex part of the polymer mold. It is also difficult with that concentration to use the formed pattern as a mask because the thickness of the formed layer would be several nm. On the other hand, if the concentration is more than 50 weight %, it is difficult to spread it evenly because of the excessive polymer.

Next, step c) is to form a polymer layer in the concave part of the polymer mold by spreading the polymer solution prepared in step b) on the polymer mold prepared in step a).

Microcontact printing is performed based on the difference of adhesion force among materials (a polymer mold, a polymer to form a pattern, and a substrate). When the difference of adhesion force between a mold and a polymer and between a polymer and a substrate is big, transcription can be successfully accomplished. The said adhesion force is related to surface energy of each material. To change the surface energy, a mold is treated with oxygen plasma or coated with a specific chemical solution. However, in the case of a device requiring an organic substrate, such surface treatment might affect the organic substrate to reduce properties of the device.

The said method facilitates patterning without any additional surface treatment. To do so, a polymer layer is formed in the concave part of the polymer mold in step c) by using the polymer mold prepared in step a) and the perfluorinated polymer having weak adhesion force.

Particularly, the method for spreading in step c) is not limited to a specific one as long as it can form a polymer layer evenly, but spin coating is preferred. At this time, the spin coating is performed at 500~3,000 rpm for 10~120 seconds.

Next, step d) is to transcribe the polymer layer formed in the concave part of the polymer mold by contacting the polymer mold with the polymer layer formed therein with a substrate, followed by pressing thereof.

In step d), the polymer mold with the polymer layer composed of the perfluorinated polymer is contacted with a substrate by microcontact printing, and then the polymer layer formed in the concave part of the polymer mold is transcribed on the substrate with pressure to fabricate a pattern.

The substrate of step d) can be any substrate as long as it has excellent adhesiveness with poly(perfluoroalkyl methacrylate) or poly(perfluoroalkyl acrylate, but is preferably exemplified by silicone substrate, glass substrate, poly methyl methacrylate (PMMA) substrate, poly vinyl pirrolidone (PVP) substrate, polystyrene (PS) substrate, polycarbonate (PC) substrate, polyethersulfone (PES) substrate, cyclic olefin copolymer (COC) substrate, TAC (triacetylcellulose) substrate, polyvinyl alcohol substrate, polyimide (PI) substrate, polyethyleneterephthalate (PET) substrate, and polyethylenenaphthalate (PEN) substrate, etc.

In step d), the pressure given to the polymer mold is 0.1~5.0 Mpa. If the pressure given to the polymer mold in step d) is less than 0.1 Mpa, it is difficult to accomplish the transcription of the perfluorinated polymer in the polymer mold. If the pressure given to the polymer mold is more than 5.0 Mpa, the polymer pattern formed thereon is slightly crushed or the polymer mold becomes damaged.

At this time, the transcription of the polymer layer in step d) is accomplished by taking advantage of the difference of adhesion force between the polymer mold and the polymer layer and between the polymer layer and the substrate. When the difference of adhesion force between them is big, transcription can be successfully accomplished to fabricate the pattern on the substrate.

The thickness of the polymer pattern fabricated by the transcription in step d) is preferably 0.1~10 μm. The thickness of the fluoro-polymer formed in the concave part of the polymer mold can be properly regulated by the depth of the concave part of the polymer mold, by which a thick polymer pattern can be fabricated.

Further, the method to form the pattern of step 1) is exemplified by another procedure comprising the following steps:

preparing a polymer mold in which a convex part and a concave part are formed (step a);

preparing a polymer solution containing a perfluorinated polymer (step b);

forming a polymer layer on the surface of the convex part and in the concave part of the polymer mold by spreading the polymer solution prepared in step b) on the polymer mold prepared in step a) (step c);

transcribing the polymer layer formed on the surface of the convex part of the polymer mold by contacting the polymer mold having the polymer layer formed in step c) with the substrate (step d); and transcribing the polymer layer formed in the concave part of the polymer mold by contacting the polymer mold finished with step d) with a new substrate and pressing thereof (step e).

Particularly, step a) is to prepare a polymer mold in which a convex part and a concave part are formed.

More specifically, step a) is to prepare a polymer mold with a convex part and a concave part formed therein in order to create a wanted pattern. At this time, the polymer mold can be prepared by using a proper template and the gap between the convex part and the concave part, and width and depth of them can be regulated to make a wanted pattern of the polymer mold.

The preparation of the polymer mold of step a) can be accomplished by spreading a polymer on the master, the template with pattern formed therein. At this time, in the pattern of the polymer mold, lines are evenly formed at the intervals of 0.5~50 μm in the thickness of 0.1~10 μm. The height of the line is 0.1~10 μm, but not always limited thereto, and in fact the polymer mold can have a variety of patterns according to the patterns of the master, the template.

Further, the polymer mold of step a) can be hard-polydimethylsiloxane (h-PDMS) mold or soft-polydimethylsiloxane (s-PDMS) mold, but hard-polydimethylsiloxane mold is more preferred.

Next, step b) is to prepare a polymer solution containing the perfluorinated polymer.

Particularly, step b) is to prepare a polymer solution to form a polymer layer on the mold prepared in step a) by dissolving the perfluorinated polymer in a solvent.

At this time, the polymer solution of step b) can include a fluoro solvent, and the fluoro solvent can be hydrofluoroether (HFE), hydrofluorocarbon, perfluorocarbon, and highly fluorinated aromatic solvent, but any solvent that can dissolve the perfluorinated polymer can be used without limitation.

The concentration of the perfluorinated polymer of step b) is preferably 1~50 weight % by the total weight of the polymer solution. If the concentration of the perfluorinated polymer of step b) is less than 1 weight % by the total weight of the polymer solution, it is difficult to spread the polymer solution on the polymer mold to form a polymer layer, more precisely difficult to form a polymer layer evenly on the surface of the convex part of the polymer mold. It is also difficult with that concentration to use the formed pattern as a mask because the thickness of the formed layer would be several nm. On the other hand, if the concentration is more than 50 weight %, it is difficult to spread it evenly because of the excessive polymer.

Next, step c) is to form a polymer layer on the surface of the convex part and in the concave part of the polymer mold by spreading the polymer solution prepared in step b) on the polymer mold prepared in step a).

Microcontact printing is performed based on the difference of adhesion force among each material (a polymer mold, a polymer to form a pattern, and a substrate). When the difference of adhesion force between a mold and a polymer and between a polymer and a substrate is big, transcription can be successfully accomplished. The said adhesion force is related to surface energy of each material. To change the surface energy, a mold is treated with oxygen plasma or coated with a specific chemical solution. However, in the case of a device requiring an organic substrate, such surface treatment might affect the organic substrate to reduce properties of the device.

The said method facilitates patterning without any additional surface treatment. To do so, a polymer layer is formed on the surface of the convex part and in the concave part of the polymer mold in step c) by using the polymer mold prepared in step a) and the perfluorinated polymer having weak adhesion force.

Particularly, the method for spreading in step c) is not limited to a specific one as long as it can form a polymer layer evenly, but spin coating is preferred. At this time, the spin coating is performed at 500~3,000 rpm for 10~120 seconds.

Next, step d) is to transcribe the polymer layer on the surface of the convex part of the polymer mold by contacting the polymer mold with the polymer layer formed in step c) with a substrate.

In step d), the polymer mold with the polymer layer composed of the perfluorinated polymer is contacted with a substrate by microcontact printing to transcribe the polymer layer formed on the surface of the convex part of the polymer mold to fabricate a pattern.

The substrate of step d) can be any substrate as long as it has excellent adhesiveness with the perfluorinated polymer, but is preferably exemplified by silicone substrate, glass substrate, poly methyl methacrylate (PMMA) substrate, poly vinyl pirrolidone (PVP) substrate, polystyrene (PS) substrate, polycarbonate (PC) substrate, polyethersulfone (PES) substrate, cyclic olefin copolymer (COC) substrate, TAC (triacetylcellulose) substrate, polyvinyl alcohol substrate, polyimide (PI) substrate, polyethyleneterephthalate (PET) substrate, and polyethylenenaphthalate (PEN) substrate, etc.

At this time, the transcription of the polymer layer in step d) is accomplished by taking advantage of the difference of adhesion force between the polymer mold and the polymer layer and between the polymer layer and the substrate. When the difference of adhesion force between them is big, transcription can be successfully accomplished to fabricate the pattern on the substrate.

The thickness of the polymer pattern formed by the transcription performed in step d) is preferably 10~500 nm. The thickness of the pattern fabricated by the transcription in step d) is the same as the thickness of the polymer layer layered on the surface of the convex part of the polymer mold, which is 10~500 nm.

Next, step e) is to transcribe the polymer layer formed in the concave part of the polymer mold by contacting the polymer mold finished with step d) with a new substrate and pressing thereof.

In step e), the polymer mold with the polymer layer composed of the perfluorinated polymer is contacted with a substrate by microcontact printing, and then the polymer layer formed in the concave part of the polymer mold is transcribed on a new substrate with pressure to fabricate a pattern.

The substrate of step e) can be any substrate as long as it has excellent adhesiveness with the perfluorinated polymer, but is preferably exemplified by silicone substrate, glass substrate, poly methyl methacrylate (PMMA) substrate, poly vinyl pirrolidone (PVP) substrate, polystyrene (PS) substrate, polycarbonate (PC) substrate, polyethersulfone (PES) substrate, cyclic olefin copolymer (COC) substrate, TAC (triacetylcellulose) substrate, polyvinyl alcohol substrate, polyimide (PI) substrate, polyethyleneterephthalate (PET) substrate, and polyethylenenaphthalate (PEN) substrate, etc.

In step e), the pressure given to the polymer mold is 0.1~5.0 Mpa. If the pressure given to the polymer mold in step e) is less than 0.1 Mpa, it is difficult to accomplish the transcription of the perfluorinated polymer in the polymer mold. If the pressure given to the polymer mold is more than 5.0 Mpa, the polymer pattern formed thereon is slightly crushed or the polymer mold becomes damaged.

At this time, the transcription of the polymer layer in step e) is accomplished by taking advantage of the difference of adhesion force between the polymer mold and the polymer layer and between the polymer layer and the substrate. When the difference of adhesion force between them is big, transcription can be successfully accomplished to fabricate the pattern on the substrate.

The thickness of the polymer pattern fabricated by the transcription in step e) is preferably 0.1~10 µm. The thickness of the fluoro-polymer formed in the concave part of the polymer mold can be properly regulated by the depth of the concave part of the polymer mold, by which a thick polymer pattern can be fabricated.

Further, the method to form the pattern of step 1) is exemplified by another procedure comprising the following steps:

preparing a polymer solution containing a perfluorinated polymer (step a); and fabricating a perfluorinated polymer thin layer pattern on a substrate with the polymer solution prepared in step a) by ink-jetting (step b).

Particularly, step a) is to prepare a polymer solution containing the perfluorinated polymer.

In step a), to form the perfluorinated polymer thin layer, a polymer solution comprising the perfluorinated polymer is prepared.

At this time, the polymer solution of step a) can include a fluoro solvent, and the fluoro solvent can be hydrofluoroether (HFE), hydrofluorocarbon, perfluorocarbon, and highly fluorinated aromatic solvent, but any solvent that can dissolve the perfluorinated polymer can be used without limitation.

The concentration of the perfluorinated polymer of step a) is preferably 1~50 weight % by the total weight of the polymer solution. If the concentration of the perfluorinated polymer of step a) is less than 1 weight % by the total weight of the polymer solution, the thickness of the polymer thin layer formed by spreading the polymer solution on the substrate would be a few nm, so that it is difficult to use the pattern as a mask. On the contrary, if the concentration is more than 50 weight %, viscosity increases owing to the excessive polymer, which troubles inkjet printing.

Next, step b) is to fabricate a perfluorinated polymer thin layer pattern on top of the substrate by using the polymer solution prepared in step a) as an inkjet printing solution.

The substrate of step b) can be any substrate as long as it has excellent adhesiveness with the perfluorinated polymer, but is preferably exemplified by silicone substrate, glass substrate, poly methyl methacrylate (PMMA) substrate, poly vinyl pirrolidone (PVP) substrate, polystyrene (PS) substrate, polycarbonate (PC) substrate, polyethersulfone (PES) substrate, cyclic olefin copolymer (COC) substrate, TAC (triacetylcellulose) substrate, polyvinyl alcohol substrate, polyimide (PI) substrate, polyethyleneterephthalate (PET) substrate, and polyethylenenaphthalate (PEN) substrate, etc.

Further, the method to form the pattern of step 1) is exemplified by another procedure comprising the following steps:

preparing a polymer solution containing a perfluorinated polymer (step a); and fabricating a polymer pattern on a substrate with the polymer solution prepared in step a) by dispensing (step b).

Particularly, step a) is to prepare a polymer solution containing the perfluorinated polymer.

In step a), to form the perfluorinated polymer thin layer, a polymer solution comprising the perfluorinated polymer is prepared.

At this time, the polymer solution of step a) can include a fluoro solvent, and the fluoro solvent can be hydrofluoroether (HFE), hydrofluorocarbon, perfluorocarbon, and highly fluorinated aromatic solvent, but any solvent that can dissolve the perfluorinated polymer can be used without limitation.

The concentration of the perfluorinated polymer of step a) is preferably 1~50 weight % by the total weight of the polymer solution. If the concentration of the perfluorinated polymer of step a) is less than 1 weight % by the total weight of the polymer solution, the thickness of the formed pattern would be a few nm, so that it is difficult to use the pattern as a mask. On the contrary, if the concentration is more than 50 weight %, spreading is hard to be accomplished due to the excessive polymer.

Next, step b) is to fabricate a polymer pattern on a substrate with the polymer solution prepared in step a) by dispensing.

The substrate of step b) can be any substrate as long as it has excellent adhesiveness with the perfluorinated polymer, but is preferably exemplified by silicone substrate, glass substrate, poly methyl methacrylate (PMMA) substrate, poly vinyl pirrolidone (PVP) substrate, polystyrene (PS) substrate, polycarbonate (PC) substrate, polyethersulfone (PES) substrate, cyclic olefin copolymer (COC) substrate, TAC (triacetylcellulose) substrate, polyvinyl alcohol substrate, polyimide (PI) substrate, polyethyleneterephthalate (PET) substrate, and polyethylenenaphthalate (PEN) substrate, etc.

Also, the method to form the pattern of step 1) is exemplified by another procedure comprising the following steps:

preparing a polymer solution containing a perfluorinated polymer (step a);

forming a perfluorinated polymer thin layer on a substrate by spreading the polymer solution prepared in step a) on top of the substrate (step b);

layering the patterned mask on top of the perfluorinated polymer thin layer formed in step b), followed by UV-irradiation (step c); and eliminating the non-irradiated part in step c) by using a solvent (step d).

Particularly, step a) is to prepare a polymer solution containing the perfluorinated polymer.

In step a), to form the perfluorinated polymer thin layer, a polymer solution comprising the perfluorinated polymer is prepared.

At this time, the polymer solution of step a) can include a fluoro solvent, and the fluoro solvent can be hydrofluoroether (HFE), hydrofluorocarbon, perfluorocarbon, and highly fluorinated aromatic solvent, but any solvent that can dissolve the perfluorinated polymer can be used without limitation.

The perfluorinated polymer of step a) can be any copolymer including most of monomers that are able to form image pattern with perfluoroalkyl methacrylate monomer by UV irradiation.

The concentration of the perfluorinated polymer of step a) is preferably 1~50 weight % by the total weight of the polymer solution. If the concentration of the perfluorinated polymer of step a) is less than 1 weight % by the total weight of the polymer solution, it is difficult to spread the polymer solution on the polymer mold to form a polymer layer. More precisely, it is difficult to form a polymer layer evenly on the surface of the convex part of the polymer mold. It is also difficult with that concentration to use the formed pattern as a mask because the thickness of the formed layer would be several nm. On the other hand, if the concentration is more than 50 weight %, it is difficult to spread it evenly because of the excessive polymer.

Next, step b) is to form a perfluorinated polymer thin layer by spreading the polymer solution prepared in step a) on top of the substrate.

In step b), the polymer solution is spread on top of the substrate by the conventional coating method to form the perfluorinated polymer thin layer thereon.

Particularly, the method for spreading in step b) is not limited to a specific one as long as it can form a polymer layer evenly, but spin coating is preferred. At this time, the spin coating is performed at 500~3,000 rpm for 10~120 seconds.

Next in step c), the patterned mask is layered on top of the perfluorinated polymer thin layer formed in step b), followed by UV-irradiation.

To form a perfluorinated polymer pattern by photolithography, in step c), the patterned mask is layered on top of the perfluorinated polymer thin layer formed in step b), followed by UV-irradiation selectively on the perfluorinated polymer thin layer.

Next, step d) is to eliminate the non-irradiated part of step c) by using a solvent.

In step d), a perfluorinated polymer pattern is formed after eliminating the non-irradiated part of the perfluorinated polymer thin layer by using a solvent.

At this time, the solvent of step d) is not limited as long as it can eliminate the perfluorinated polymer. For example, the solvent of step d) can include a fluoro solvent, and the fluoro solvent can be hydrofluoroether (HFE), hydrofluorocarbon, perfluorocarbon, and highly fluorinated aromatic solvent.

The thickness of the perfluorinated polymer pattern of step d) can be 50 nm~10 μm and the thickness varies from the preparation methods.

The method to form the pattern of step 1) is also exemplified by another procedure comprising the following steps:

preparing a polymer solution containing a perfluorinated polymer (step a);

forming a perfluorinated polymer thin layer on top of the polymer mold by spreading the polymer solution prepared in step a) thereon (step b);

layering the patterned mask on top of the perfluorinated polymer thin layer formed in step b), followed by UV-irradiation (step c);

eliminating the non-irradiated part in step c) by using a solvent (step d); and transcribing the pattern formed in step d) on the polymer mold by contacting the pattern with a substrate (step e).

Particularly, step a) is to prepare a polymer solution containing the perfluorinated polymer.

In step a), to form the perfluorinated polymer thin layer, a polymer solution comprising the perfluorinated polymer is prepared.

At this time, the polymer solution of step a) can include a fluoro solvent, and the fluoro solvent can be hydrofluoroether (HFE), hydrofluorocarbon, perfluorocarbon, and highly fluorinated aromatic solvent, but any solvent that can dissolve the perfluorinated polymer can be used without limitation.

The perfluorinated polymer of step a) can be any copolymer including most of monomers that are able to form image pattern with perfluoroalkyl methacrylate monomer by UV irradiation.

The concentration of the perfluorinated polymer of step a) is preferably 1~50 weight % by the total weight of the polymer solution. If the concentration of the perfluorinated polymer of step a) is less than 1 weight % by the total weight of the polymer solution, it is difficult to spread the polymer solution on the polymer mold to form a polymer layer. More precisely, it is difficult to form a polymer layer evenly on the surface of the convex part of the polymer mold. It is also difficult with that concentration to use the formed pattern as a mask because the thickness of the formed layer would be several nm. On the other hand, if the concentration is more than 50 weight %, it is difficult to spread it evenly because of the excessive polymer.

Next, step b) is to form a perfluorinated polymer thin layer by spreading the polymer solution prepared in step a) on top of the polymer mold.

In step b), a perfluorinated polymer thin layer is formed on top of the polymer mold by spreading the polymer solution prepared in step a) thereon.

At this time, the polymer mold of step b) can be any plain polymer mold without any pattern, for example hard-polydimethylsiloxane (h-PDMS) mold or soft-polydimethylsiloxane (s-PDMS) mold, but hard-polydimethylsiloxane mold is more preferred.

Particularly, the method for spreading in step b) is not limited to a specific one as long as it can form a polymer layer evenly, but spin coating is preferred. At this time, the spin coating is performed at 500~3,000 rpm for 10~120 seconds.

Next in step c), the patterned mask is layered on top of the perfluorinated polymer thin layer formed in step b), followed by UV-irradiation.

To form a perfluorinated polymer pattern by photolithography, in step c), the patterned mask is layered on top of the perfluorinated polymer thin layer formed in step b), followed by UV-irradiation selectively on the perfluorinated polymer thin layer.

Next, step d is to fabricate a pattern by eliminating the non-irradiated part in step c) by using a solvent.

In step d), a perfluorinated polymer pattern is formed after eliminating the non-irradiated part of the perfluorinated polymer thin layer by using a solvent.

At this time, the solvent of step d) is not limited as long as it can eliminate the perfluorinated polymer. For example, the solvent of step d) can include a fluoro solvent, and the fluoro solvent can be hydrofluoroether (HFE), hydrofluorocarbon, perfluorocarbon, and highly fluorinated aromatic solvent.

Step e) is to transcribe the pattern fabricated in step d) on the surface of the polymer mold by contacting the pattern with a substrate.

In step e), the pattern formed on the surface of the polymer mold is transcribed on a substrate by contacting the pattern with the substrate to minimize the damage on the substrate.

The substrate of step e) can be any substrate as long as it has excellent adhesiveness with the perfluorinated polymer, but is preferably exemplified by silicone substrate, glass substrate, poly methyl methacrylate (PMMA) substrate, poly vinyl pirrolidone (PVP) substrate, polystyrene (PS) substrate, polycarbonate (PC) substrate, polyethersulfone (PES) substrate, cyclic olefin copolymer (COC) substrate, TAC (triacetylcellulose) substrate, polyvinyl alcohol substrate, polyimide (PI) substrate, polyethyleneterephthalate (PET) substrate, and polyethylenenaphthalate (PEN) substrate, etc.

At this time, the transcription of the polymer layer in step e) is accomplished by taking advantage of the difference of adhesion force between the polymer mold and the perfluorinated polymer pattern and between the perfluorinated polymer pattern and the substrate. When the difference of adhesion force between them is big, transcription can be successfully accomplished to fabricate the pattern on the substrate.

As described hereinbefore, the perfluorinated polymer pattern can be fabricated by a variety of methods and at this time the thickness of the pattern is 50 nm~10 μm, suggesting that patterns with different thicknesses can be fabricated according to diverse methods.

In the method for fabricating nano material pattern of the present invention, step 2) is to spread the dispersion containing nano material dispersed therein on the substrate having the pattern of step 1) fabricated thereon.

In step 2), the dispersion containing nano material dispersed therein is spread on the substrate on which the perfluorinated polymer pattern was fabricated in step 1) so as to spread the nano material included in the dispersion on the area where the perfluorinated polymer pattern has not been fabricated.

Particularly, the nano material of step 2 is exemplified by metal nano wire, oxide nano wire, carbon nano tube, graphene, metal nano particle, and oxide nano particle, etc.

The dispersion of step 2) can be any solvent that is able to disperse nano material, and alcohols are the examples. More precisely, isopropylalcohol (IPA) and ethanol are preferred examples. The solvent used for making the dispersion of step 2) is preferably the one that does not dissolve the perfluorinated polymer pattern.

In the method for fabricating nano material pattern of the present invention, step 3) is to eliminate the perfluorinated polymer pattern fabricated on the substrate in step 2).

To fabricate a nano material pattern by the conventional lift-off technique, such a solvent as acetone is used to eliminate a polymer pattern. At this time, exfoliation of nano material caused by the solvent like acetone is a problem.

Therefore, in this invention, such a solvent that does not exfoliate nano material is used. By using the solvent that does not exfoliate nano material, the perfluorinated polymer pattern is eliminated to fabricate a nano material pattern. As a result, an excellent nano material pattern can be fabricated.

Particularly, the perfluorinated polymer pattern can be eliminated by using a solvent in step 3). At this time, the solvent is preferably a fluoro solvent. The fluoro solvent can be hydrofluoroether (HFE), hydrofluorocarbon, perfluorocarbon, and highly fluorinated aromatic solvent, but any solvent that can dissolve the perfluorinated polymer can be used without limitation.

The present invention also provides a method for fabricating nano material pattern comprising the following steps:

forming a perfluorinated polymer pattern on top of the substrate (step 1);

spreading a dispersion containing the dispersed nano material and a functional material on the substrate patterned in step 1) (step 2); and eliminating the perfluorinated polymer pattern formed on the substrate of step 2) (step 3).

Hereinafter, the method for fabricating nano material pattern of the present invention is described in more detail, step by step.

First, in the method for fabricating nano material pattern of the invention, step 1) is to form a perfluorinated polymer pattern on top of the substrate. This procedure is as described above, so that the explanation is not repeated herein.

Next, in the method for fabricating nano material pattern of the invention, step 2) is to spread the dispersion containing nano material dispersed therein and the functional material on the substrate patterned in step 1).

In step 2), the dispersion containing nano material dispersed therein and the functional material are spread on the substrate on which the perfluorinated polymer pattern was fabricated in step 1) so as to spread them on the area where the perfluorinated polymer pattern has not been fabricated.

Particularly, to spread the dispersion containing nano material dispersed therein and the functional material on the substrate in step 2), one of the following methods can be used; the dispersion containing nano material dispersed therein is spread first and then the functional material is spread; the functional material is first spread and then the dispersion containing nano material dispersed therein is spread thereon; or the functional material is spread and then the dispersion containing nano material dispersed therein is layered and then the functional material is spread thereon again.

For example, the nano material pattern can be formed by the processes of spreading the dispersion containing nano material dispersed therein and then spreading the functional material, by which the nano material pattern has the structure in which the nano material and the functional material are layered in that order. The nano material pattern can also be formed by the processes of spreading the functional material first and then spreading the dispersion containing nano material dispersed therein, by which the nano material pattern has the structure in which the functional material and the nano material are layered in that order.

The nano material pattern can also be generated by the processes of spreading the functional material, spreading the dispersion containing nano material dispersed therein, and then spreading the functional material again, resulting in the nano material pattern having the structure in which functional material/nano material/functional material are layered in that order.

Particularly, the nano material of step 2) is exemplified by metal nano wire, oxide nano wire, carbon nano tube, graphene, metal nano particle, and oxide nano particle, etc.

The dispersion of step 2) can be any solvent that is able to disperse nano material, and alcohols are the examples. More precisely, isopropylalcohol (IPA) and ethanol are preferred examples. The solvent used for making the dispersion of step 2) is preferably the one that does not dissolve the perfluorinated polymer pattern.

Further, the functional material of step 2) is selected from the group consisting of inorganic substances such as metal oxides, and organic substances such as conducting polymers, UV curable polymers, thermal curable polymers, and dielectric polymers. In addition to the said organic substances, antioxidants or nano particles can also be included.

For example, the conducting polymer herein can be selected from the group consisting of poly(3,4-ethylenedioxythiophene) polystyrene sulfonate (PEDOT:PSS), polyaniline, polyacetylene, polypyrrole, polythiophene, poly(3-alkyl thiophene) (P3AT), polyphenylene, polyfuran, and polyphenylene sulfide.

The UV curable polymer herein can be bisphenol A-type epoxy resin or polyurethane. The thermal curable polymer can be phenol resin, epoxy resin, or unsaturated polyester resin. The said dielectric polymer can be selected from the group consisting of polymethyl methacrylate (PMMA), polyvinylpyrrolidone (PVP), polyethylene (PE), polyvinyl chloride (PVC), polyvinylidene fluoride (PVDF), polytetrafluoroethylene (PTFE), perfluoroalkoxy (PFA), and nylon, but not always limited thereto.

In the spreading of step 2), the inorganic substance such as metal oxide can be spread by plasma deposition. The organic substance can be spread by spin coating, spray coating, dip coating, or dispensing, but not always limited thereto and any method applicable for the spreading a functional material (inorganic substance or organic substance) can be used without limitation.

After spreading the functional material in step 2), post-treatment such as UV irradiation or heat treatment can be performed according to the characteristics of the functional material.

Further, the substrate can be etched before the coating with the nano material and the functional material of step 2) in order to make some room for the nano material and the functional material to be inserted. The substrate etching can be accomplished by Dry or Wet method according to the properties of the substrate used.

Next, in the method for fabricating nano material pattern of the invention, step 3) is to eliminate the perfluorinated polymer pattern formed on the substrate in step 2). This procedure is as described above, so that the explanation is not repeated herein.

The present invention also provides a method for fabricating nano material pattern comprising the following steps:
forming a perfluorinated polymer pattern on top of the substrate (step 1);
spreading a dispersion containing the dispersed nano material on the substrate patterned in step 1) (step 2)
eliminating the perfluorinated polymer pattern formed on the substrate of step 2) (step 3); and
inserting the nano material pattern formed by eliminating the perfluorinated polymer pattern in step 3 into the inside of the substrate (step 4).

Hereinafter, the method for fabricating nano material pattern of the present invention is described in more detail, step by step.

First, in the method for fabricating nano material pattern of the invention, step 1) is to form a perfluorinated polymer pattern on top of the substrate. This procedure is as described above, so that the explanation is not repeated herein.

Next, in the method for fabricating nano material pattern of the invention, step 2) is to spread the dispersion containing nano material dispersed therein on the substrate patterned in step 1). This procedure is as described above, so that the explanation is not repeated herein.

Next, in the method for fabricating nano material pattern of the invention, step 3) is to eliminate the perfluorinated polymer pattern formed on the substrate in step 2). This procedure is as described above, so that the explanation is not repeated herein.

In the method for fabricating nano material pattern of the invention, step 4) is to insert the nano material pattern formed after eliminating the perfluorinated polymer pattern in step 3) into the inside of the substrate.

Particularly, step 4) is to insert the nano material pattern remaining after the elimination of the perfluorinated polymer pattern in step 3) into the substrate.

In a preferred embodiment of the present invention, to insert the nano material into the substrate in step 4), when the substrate of step 1) at this time is an organic substrate, thermo-compression is given on top of the substrate with the nano material pattern fabricated thereon, as shown in FIG. 1(a).

When the substrate of step 1) is an inorganic substrate, step 4) is accomplished by inserting the nano material pattern into a new organic substrate by contacting the nano material pattern generated on the inorganic substrate with the new organic substrate and then being followed by thermo-compression, as shown in FIG. 1(b).

At this time, the organic substrate can be selected from the group consisting of poly methyl methacrylate (PMMA) substrate, poly vinyl pirrolidone (PVP) substrate, polystyrene (PS) substrate, polycarbonate (PC) substrate, polyethersulfone (PES) substrate, cyclic olefin copolymer (COC) substrate, TAC (Triacetylcellulose) substrate, polyvinyl alcohol substrate, polyimide (PI) substrate, polyethyleneterephthalate (PET) substrate, and polyethylenenaphthalate (PEN) substrate.

The present invention also provides a substrate on which a nano material pattern is fabricated by the above method.

By using the substrate on which a nano material pattern is fabricated of the present invention, damage of the substrate and nano material can be minimized by using a fluoro solvent during the pattern elimination process. Therefore, this substrate can be widely applied to the fields requiring organic devices.

Practical and presently preferred embodiments of the present invention are illustrative as shown in the following Examples.

However, it will be appreciated that those skilled in the art, on consideration of this disclosure, may make modifications and improvements within the spirit and scope of the present invention.

Manufacturing Example 1

Preparation of Perfluorinated Polymer Pattern 1

Step 1: Photoresist master (Photoresist, AZ 7220) was formed on a silicone substrate, which was then coated with poly(dimethylsiloxane) (PDMS) by spin coating, followed by hardening at 120° C. As a result, a polymer mold was prepared.

At this time, the polymer mold was soft-polydimethylsiloxane (s-PDMS, Sylgard 184, Dow Corning) and the pattern was 90 μm line and space in which the height difference between the convex part and the concave part was 3 μm.

Step 2: 1H,1H,2H,2H-perfluorodecyl methacrylate (FDMA) was dissolved in hydrofluoroether to prepare a mixed solution containing the polymer at the concentration of 11 weight % by the total weight of the solution.

Step 3: The mixed solution prepared in step 2) was spread on the polymer mold prepared in step 1), followed by spin coating at 1,000 rpm for 30 seconds to form poly(1H,1H,2H,2H-perfluorodecyl methacrylate) (PFDMA).

Step 4: The convex part of the polymer mold wherein poly(1H,1H,2H,2H-perfluorodecyl methacrylate) was formed in step 3) was contacted with a silicone substrate to fabricate a poly(1H,1H,2H,2H-perfluorodecyl methacrylate polymer pattern having the width of 90 μm.

Manufacturing Example 2

Preparation of Perfluorinated Polymer Pattern 2

Step 1: Photoresist (AZ 7220) patterns in the width of 5 μm~100 μm were formed on a silicone substrate containing 1 μm thick silicone oxide film and then the silicone oxide film was dry-etched. The prepared silicone master was coated with poly(dimethylsiloxane) (PDMS) by spin coating, followed by hardening at 120° C. As a result, a polymer mold was prepared.

At this time, the polymer mold was hard-polydimethylsiloxane (h-PDMS, HS-8900, HSSTS). The line width of the convex part was fixed as 50 μm, and the line width of the concave part was 5 μm~100 μm. The height difference between the convex part and the concave part was 1 μm.

Step 2: 1H,1H,2H,2H-perfluorodecyl methacrylate (FDMA) was dissolved in hydrofluoroether to prepare a mixed solution containing the polymer at the concentration of 9 weight % by the total weight of the solution.

Step 3: The mixed solution prepared in step 2) was spread on the polymer mold prepared in step 1), followed by spin coating at 1,000 rpm for 30 seconds to form poly(1H,1H,2H,2H-perfluorodecyl methacrylate) (PFDMA).

Step 4: The convex part of the polymer mold wherein poly(1H,1H,2H,2H-perfluorodecyl methacrylate) was formed in step 3) was contacted with a glass substrate to fabricate a poly(1H,1H,2H,2H-perfluorodecyl methacrylate polymer pattern having the width of 50 μm.

Manufacturing Example 3

Preparation of Perfluorinated Polymer Pattern 3

Step 1: Photoresist (AZ 4620) patterns in the width of μm~100 μm were formed on a silicone substrate. The prepared photoresist master was coated with poly(dimethylsiloxane) (PDMS) by spin coating, followed by hardening at 120° C. As a result, a polymer mold was prepared.

At this time, the polymer mold was hard-polydimethylsiloxane (h-PDMS, HS-8900, HSSTS). The line width of the convex part was fixed as 50 μm, and the line width of the concave part was 5 μm~100 μm. The height difference between the convex part and the concave part was 5 μm.

Step 2: 1H,1H,2H,2H-perfluorodecyl methacrylate (FDMA) was dissolved in hydrofluoroether to prepare a mixed solution containing the polymer at the concentration of 15 weight % by the total weight of the solution.

Step 3: The mixed solution prepared in step 2) was spread on the polymer mold prepared in step 1), followed by spin coating at 1,000 rpm for 30 seconds to form poly(1H,1H,2H,2H-perfluorodecyl methacrylate) (PFDMA).

Step 4: The convex part of the polymer mold wherein poly(1H,1H,2H,2H-perfluorodecyl methacrylate) was formed in step 3) was contacted with a polyethylenenaphthalate (PEN) substrate to fabricate a poly(1H,1H,2H,2H-perfluorodecyl methacrylate polymer pattern having the width of 50 μm.

Manufacturing Example 4

Preparation of Perfluorinated Polymer Pattern 4

Step 1: Photoresist (DNR L-300) pattern with a specific shape was formed on a silicone substrate. The prepared photoresist master was coated with poly(dimethylsiloxane) (PDMS) by spin coating, followed by hardening at 120° C. As a result, a polymer mold was prepared.

At this time, the polymer mold was (s-PDMS, Sylgard 184, Dow Corning). The height difference between the convex part and the concave part was 2 μm.

Step 2: 1H,1H,2H,2H-perfluorodecyl methacrylate (FDMA) was dissolved in hydrofluoroether to prepare a mixed solution containing the polymer at the concentration of 13 weight % by the total weight of the solution.

Step 3: The mixed solution prepared in step 2) was spread on the polymer mold prepared in step 1), followed by spin coating at 1,000 rpm for 30 seconds to form poly(1H,1H,2H,2H-perfluorodecyl methacrylate) (PFDMA).

Step 4: The polymer mold wherein poly(1H,1H,2H,2H-perfluorodecyl methacrylate) was formed in step 3) was contacted with a silicone substrate to fabricate a poly(1H,1H,2H,2H-perfluorodecyl methacrylate polymer pattern.

Manufacturing Example 5

Preparation of Perfluorinated Polymer Pattern 5

Step 1: Photoresist (DNR L-300) pattern was formed on a silicone substrate. The prepared photoresist master was coated with poly(dimethylsiloxane) (PDMS) by spin coating, followed by hardening at 120° C. As a result, a polymer mold was prepared.

At this time, the polymer mold was soft-polydimethylsiloxane (s-PDMS, Sylgard 184, Dow Corning). The width of the convex part was 5 μm, and the width of the concave part was 8 μm. The height difference between the convex part and the concave part was 2 μm.

Step 2: 1H,1H,2H,2H-perfluorodecyl methacrylate (FDMA) was dissolved in hydrofluoroether to prepare a mixed solution containing the polymer at the concentration of 13 weight % by the total weight of the solution.

Step 3: The mixed solution prepared in step 2) was spread on the polymer mold prepared in step 1), followed by spin coating at 1,000 rpm for 30 seconds to form poly(1H,1H,2H,2H-perfluorodecyl methacrylate) (PFDMA).

Step 4: The convex part of the polymer mold wherein poly(1H,1H,2H,2H-perfluorodecyl methacrylate) was formed in step 3) was contacted with a glass substrate to fabricate a poly(1H,1H,2H,2H-perfluorodecyl methacrylate polymer pattern having the width of 5 μm.

Manufacturing Example 6

Preparation of Perfluorinated Polymer Pattern 6

After finishing step 4) of Manufacturing Example 1, the polymer mold was contacted with a new silicone substrate. Then, 0.2 Mpa of pressure was given to transcribe the poly (1H,1H,2H,2H-perfluorodecyl methacrylate) formed in the concave part of the polymer mold on the silicone substrate, resulting in the fabrication of a polymer pattern.

Manufacturing Example 7

Preparation of Perfluorinated Polymer Pattern 7

Step 1: 3,3,4,4,5,5,6,6,7,7,8,8,9,9,10,10,10-heptadecafluorodecyl methacrylate and 2-nitrobenzyl methacrylate were dissolved in hydrofluoroether (HFE 7600, 3M) to prepare a mixed solution containing the polymer at the concentration of 10 weight % by the total weight of the solution.

Step 2: The mixed solution prepared in step 1) was spread on a silicone substrate, followed by spin coating at 1,000 rpm for 30 seconds to form fluoro photoresist.

Step 3: The patterned mask was placed on top of the fluoro photoresist thin layer formed in step 2), followed by UV-irradiation.

Step 4: The non-irradiated perfluorinated polymer in step 3) was eliminated by using HFE 7200, the fluoro solvent, resulting in the fabrication of a polymer pattern.

Manufacturing Example 8

Preparation of Perfluorinated Polymer Pattern 8

Step 1: 3,3,4,4,5,5,6,6,7,7,8,8,9,9,10,10,10-heptadecafluorodecyl methacrylate and 2-nitrobenzyl methacrylate were dissolved in hydrofluoroether (HFE 7600, 3M) to prepare a mixed solution containing the polymer at the concentration of 10 weight % by the total weight of the solution.

Step 2: The mixed solution prepared in step 1) was spread on a silicone substrate, followed by spin coating at 1,000 rpm for 30 seconds to form fluoro photoresist.

Step 3: The patterned mask was placed on top of the fluoro photoresist thin layer formed in step 2), followed by UV-irradiation.

Step 4: The non-irradiated perfluorinated polymer in step 3) was eliminated by using HFE 7200, the fluoro solvent, resulting in the fabrication of a polymer pattern.

Step 5: A polymer pattern was fabricated by contacting the substrate having the polymer pattern fabricated in step 4) on a silicone substrate.

Manufacturing Example 9

Preparation of Perfluorinated Polymer Pattern 9

A polymer pattern was fabricated by the same manner as described in Manufacturing Example 4 except that the poly (1H,1H,2H,2H-perfluorodecyl methacrylate polymer pattern is generated by contacting with a polyethylenenaphthalate (PEN) substrate in step 4) of Manufacturing Example 4.

Manufacturing Example 10

Preparation of Perfluorinated Polymer Pattern 10

A polymer pattern was fabricated by the same manner as described in Manufacturing Example 4 except that the poly (1H,1H,2H,2H-perfluorodecyl methacrylate polymer pattern is generated by contacting with a glass substrate in step 4) of Manufacturing Example 4.

Example 1

Preparation of Nano Material Pattern 1

Step 1: The substrate having the pattern fabricated in Manufacturing Example 1 was prepared.

Step 2: A dispersion was prepared by adding silver nano wire to isopropyl alcohol (IPA) at the concentration of 0.5 weight % by the weight of the total solution and dispersing thereof. The prepared dispersion was spread on the substrate prepared in step 1).

Step 3: The perfluorinated polymer pattern on the substrate spread with the silver nano wire dispersion prepared in step 2) was eliminated by using HFE 7200, the fluoro solvent, to fabricate a silver nano wire pattern in the width of 90 µm.

Example 2

Preparation of Nano Material Pattern 2

A silver nano wire pattern was fabricated by the same manner as described in Example 1 except that the substrate having the pattern fabricated in Manufacturing Example 2 was used in step 1) of Example 1.

Example 3

Preparation of Nano Material Pattern 3

A silver nano wire pattern was fabricated by the same manner as described in Example 1 except that the substrate having the pattern fabricated in Manufacturing Example 3 was used in step 1) of Example 1.

Example 4

Preparation of Nano Material Pattern 4

A silver nano wire pattern was fabricated by the same manner as described in Example 1 except that the substrate having the pattern fabricated in Manufacturing Example 4 was used in step 1) of Example 1.

Example 5

Preparation of Nano Material Pattern 5

Step 1: The substrate having the pattern fabricated in Manufacturing Example 5 was prepared.

Step 2: A dispersion was prepared by adding carbon nano tube to isopropyl alcohol (IPA) at the concentration of 0.5 weight % by the weight of the total solution and dispersing thereof. The prepared dispersion was spread on top of the substrate prepared in step 1).

Step 3: The perfluorinated polymer pattern on the substrate spread with the carbon nano tube dispersion in step 2) was eliminated by using HFE 7300, the fluoro solvent, to fabricate a carbon nano tube pattern in the width of 8 µm.

Example 6

Preparation of Nano Material Pattern 6

A silver nano wire pattern was fabricated by the same manner as described in Example 1 except that the substrate having the pattern fabricated in Manufacturing Example 6 was used in step 1) of Example 1.

Example 7

Preparation of Nano Material Pattern 7

A silver nano wire pattern was fabricated by the same manner as described in Example 1 except that the substrate having the pattern fabricated in Manufacturing Example 7 was used in step 1) of Example 1.

Example 8

Preparation of Nano Material Pattern 8

A silver nano wire pattern was fabricated by the same manner as described in Example 1 except that the substrate having the pattern fabricated in Manufacturing Example 8 was used in step 1) of Example 1.

Example 9

Preparation of Nano Material Pattern 9

Step 1: The substrate having the pattern fabricated in Manufacturing Example 4 was prepared.
Step 2: A dispersion was prepared by adding silver nano wire to isopropyl alcohol (IPA) at the concentration of 0.5 weight % by the weight of the total solution and dispersing thereof. The prepared dispersion was spread on top of the substrate prepared in step 1).
Then, a functional material dispersion was prepared by adding poly(3,4-ethylenedioxythiophene):polystyrene sulfonate (PEDOT:PSS) to isopropyl alcohol (IPA) (0.1 weight %) to isopropyl alcohol (IPA) at the ratio of 1:4 (v/v) and dispersing thereof. The prepared functional material dispersion was spread on top of the substrate layered with the silver nano wire in order to form the PEDOT:PSS layer thereon.
Step 3: The perfluorinated polymer pattern on the substrate on which the silver nano wire and the PEDOT:PBS layer had been formed in step 2) was eliminated by using HFE 7300, the fluoro solvent, to fabricate a silver nano wire/PEDOT:PSS pattern in the width of 25 μm.

Example 10

Preparation of Nano Material Pattern 10

A silver nano wire/PEDOT:PSS pattern was fabricated by the same manner as described in Example 9 except that the substrate having the pattern fabricated in Manufacturing Example 9 was used in step 1) of Example 9.

Example 11

Preparation of Nano Material Pattern 11

Step 1: The substrate having the pattern fabricated in Manufacturing Example 4 was prepared.
Step 2: A dispersion was prepared by adding carbon nano tube to isopropyl alcohol (IPA) at the concentration of 0.1 weight % by the weight of the total solution and dispersing thereof. The prepared dispersion was spread on top of the substrate prepared in step 1).
Then, a functional material dispersion was prepared by adding polyvinylpyrrolidone (0.01 weight %) to isopropyl alcohol (IPA) at the ratio of 1:4 (v/v) and dispersing thereof. The prepared functional material dispersion was spread on top of the substrate layered with the carbon nano tube in order to form the polyvinylpyrrolidone layer thereon.
Step 3: The perfluorinated polymer pattern on the substrate on which the carbon nano tube and the polyvinylpyrrolidone layer had been formed in step 2) was eliminated by using HFE 7300, the fluoro solvent, to fabricate a carbon nano tube/polyvinylpyrrolidone pattern in the width of 5 μm.

Example 12

Preparation of Nano Material Pattern 12

Step 1: The substrate having the pattern fabricated in Manufacturing Example 4 was prepared.
Step 2: A dispersion was prepared by adding silver nano wire to isopropyl alcohol (IPA) at the concentration of 0.5 weight % by the weight of the total solution and dispersing thereof. The prepared dispersion was spread on top of the substrate prepared in step 1).
Step 3: The perfluorinated polymer pattern on the substrate spread with the silver nano wire dispersion in step 2) was eliminated by using HFE 7300, the fluoro solvent, to fabricate a silver nano wire pattern in the width of 25 μm.
In the above, the polyethylenenaphthalate (PEN) substrate was placed on the glass substrate with the silver nano wire pattern formed thereon, to which 300 KPa pressure was given at 100° C. in order to insert the silver nano wire into the polyethylenenaphthalate substrate.

Example 13

Preparation of Nano Material Pattern 13

Step 1: The substrate having the pattern fabricated in Manufacturing Example 10 was prepared.
Step 2: A dispersion was prepared by adding silver nano wire to isopropyl alcohol (IPA) at the concentration of 0.5 weight % by the weight of the total solution and dispersing thereof. The prepared dispersion was spread on top of the substrate prepared in step 1).
Step 3: The perfluorinated polymer pattern on the substrate spread with the silver nano wire dispersion in step 2) was eliminated by using HFE 7300, the fluoro solvent, to fabricate a silver nano wire pattern in the width of 25 μm.
In the above, the silver nano wire was inserted into the polyethylenenaphthalate (PEN) substrate having the silver nano wire pattern fabricated thereon by pressing the top of the substrate with 300 KPa at 100° C.

Experimental Example 1

Observation Under Scanning Electron Microscope

Figure 6:
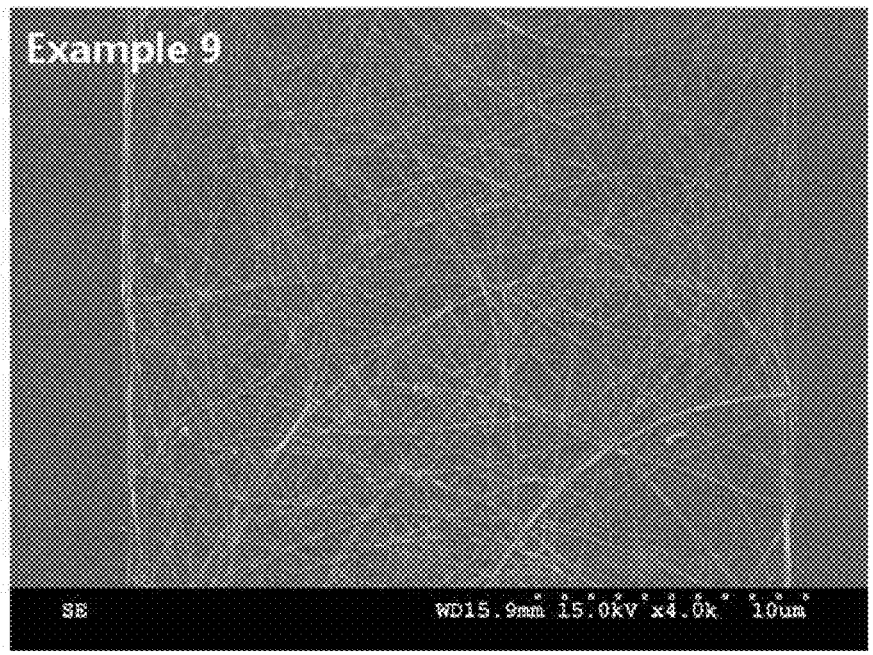
FIG. 6~FIG. 8 are photographs of the nano material patterns containing the functional materials fabricated in example 9~example 11 of the present invention, observed under scanning electron microscope (SEM)
Figure 7:
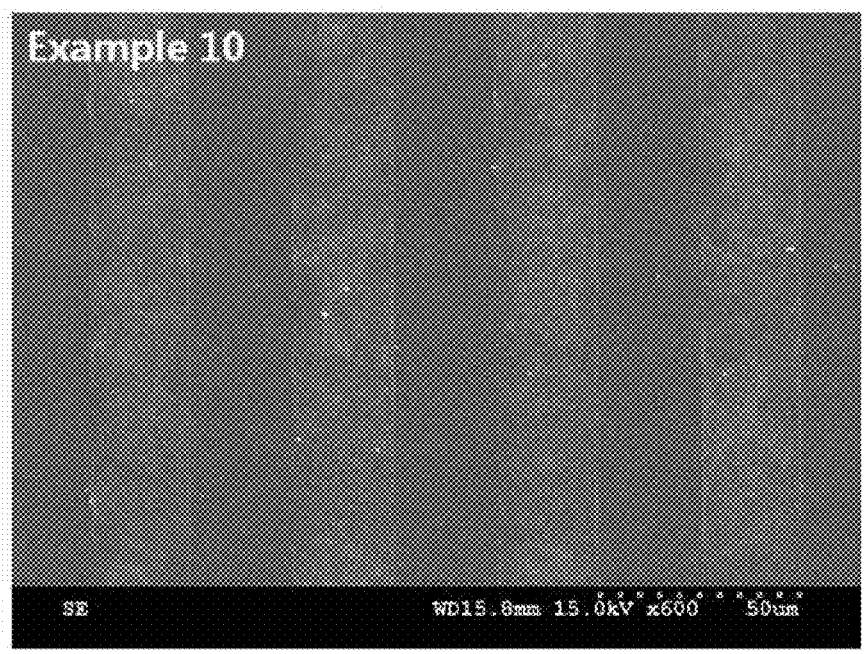
Figure 8:
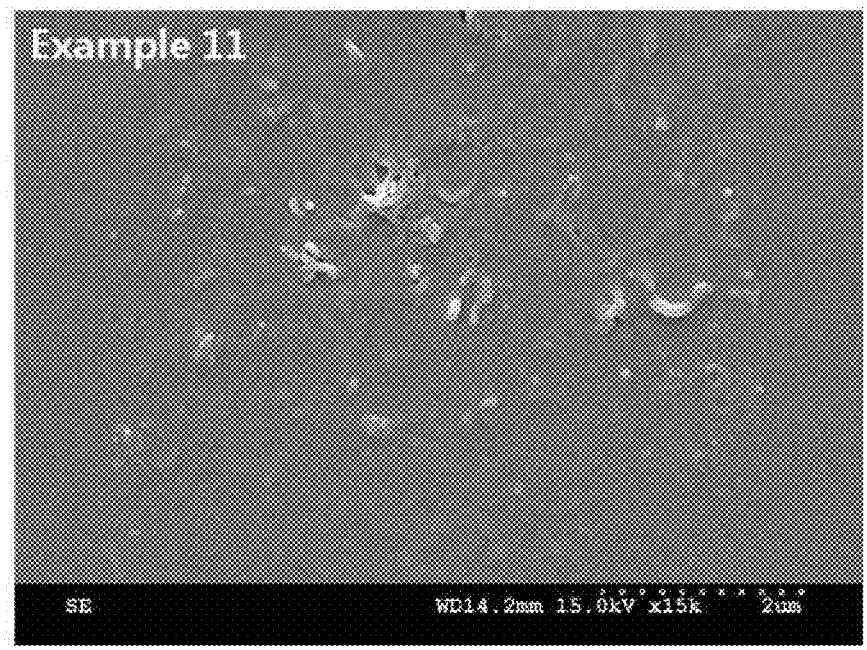
Figure 9:
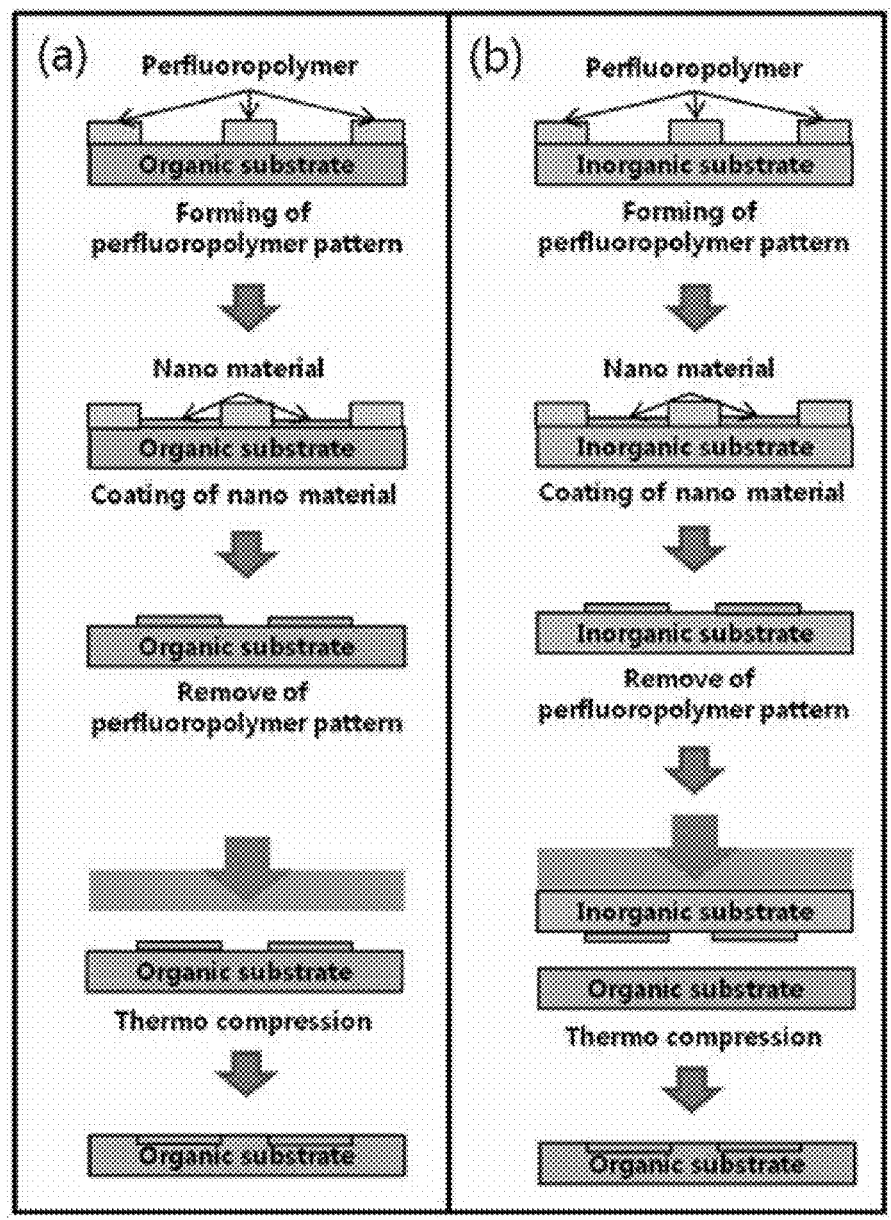
FIG. 9 is a schematic diagram illustrating an example of the methods for inserting the nano material pattern into the inside of the substrate in step 4) of the method of the invention.

The surface morphologies of the substrates having the nano material patterns fabricated in Examples 1~5, and 9~13 were observed under scanning electron microscope (SEM) and the results are shown in FIGS. 1-5, FIG. 10 and FIG. 11.
As shown in FIG. 1~FIG. 5, it was confirmed that the nano materials of the invention, silver nano wire and carbon nano tube, formed an even pattern.
As shown in FIG. 6~FIG. 8, the nano materials of the invention showed a regular pattern in which silver nano wire and carbon nano tube, the nano materials of the present invention, were layered evenly.

Figure 10:
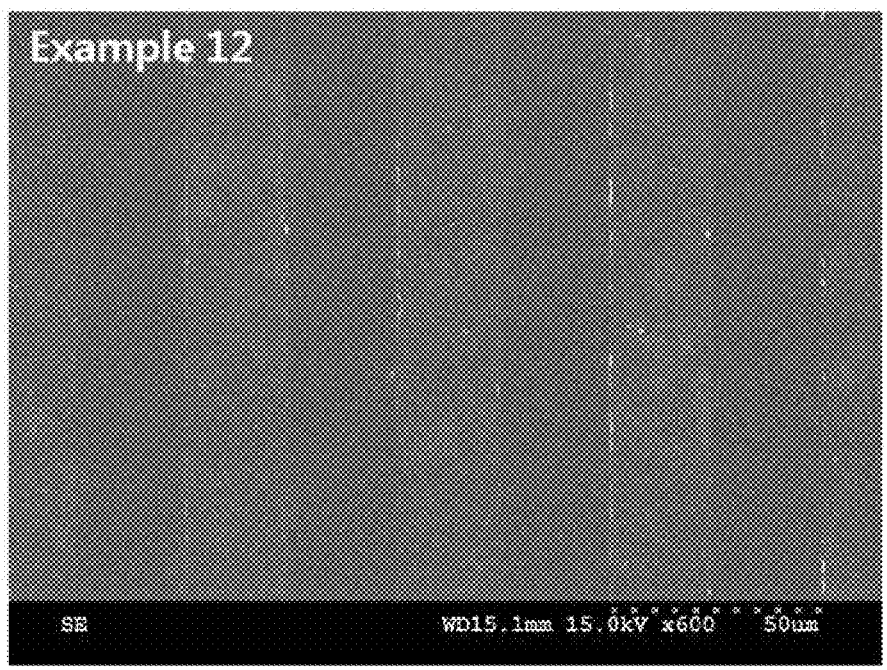
FIG. 10 and FIG. 11 are photographs of the nano material patterns inserted in the substrate in examples 12 and 13 of the present invention, observed under scanning electron microscope (SEM).
Figure 11:
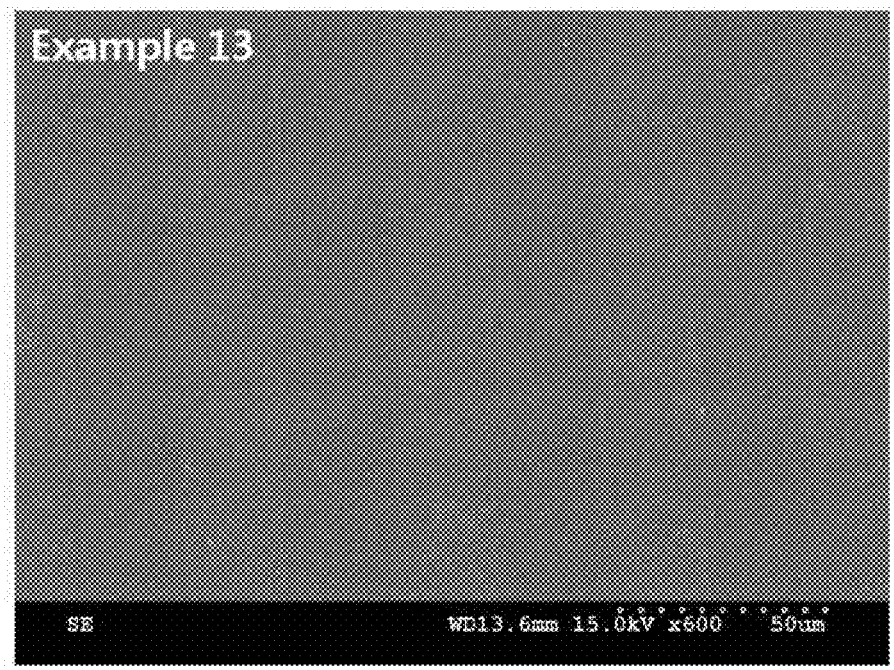

As shown in FIG. 10 and FIG. 11, silver nano wire, the nano material of the present invention, was inserted in the organic substrate to form a regular pattern.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended Claims.

What is claimed is:

1. A method for fabricating nano material pattern comprising the following steps:
   forming a perfluorinated polymer pattern on top of the substrate (step 1);
   spreading a dispersion containing the dispersed nano material on the substrate patterned in step 1) (step 2); and
   eliminating the perfluorinated polymer pattern formed on the substrate of step 2) (step 3).

2. The method for fabricating nano material pattern according to claim 1, wherein the method to form the pattern of step 1) is composed of the following steps:
   preparing a polymer mold in which a convex part and a concave part are formed (step a);
   preparing a polymer solution containing a perfluorinated polymer (step b);
   forming a polymer layer on the surface of the convex part of the polymer mold by spreading the polymer solution prepared in step b) on the polymer mold prepared in step a) (step c); and
   transcribing the polymer layer formed on the surface of the convex part of the polymer mold by contacting the polymer mold having the polymer layer formed in step c) with the substrate (step d).

3. The method for fabricating nano material pattern according to claim 2, wherein the polymer mold of step a) is hard-polydimethylsiloxane (h-PDMS) or soft-polydimethylsiloxane (s-PDMS) mold.

4. The method for fabricating nano material pattern according to claim 2, wherein the polymer solution of step b) includes a fluoro solvent.

5. The method for fabricating nano material pattern according to claim 2, wherein the concentration of the perfluorinated polymer of step b) is 1~50 weight % by the total weight of the polymer solution.

6. The method for fabricating nano material pattern according to claim 1, wherein the method to form the pattern in step 1) is composed of the following steps:
   preparing a polymer mold in which a convex part and a concave part are formed (step a);
   preparing a polymer solution containing a perfluorinated polymer (step b);
   forming a polymer layer in the concave part of the polymer mold by spreading the polymer solution prepared in step b) on the polymer mold prepared in step a) (step c); and
   transcribing the polymer layer formed in the concave part of the polymer mold by contacting the polymer mold having the polymer layer formed in step c) with the substrate (step d).

7. The method for fabricating nano material pattern according to claim 6, wherein the pressure given to the polymer mold of step d) is 0.1~5.0 Mpa.

8. The method for fabricating nano material pattern according to claim 1, wherein the method to form the pattern in step 1) is composed of the following steps:
   preparing a polymer mold in which a convex part and a concave part are formed (step a);
   preparing a polymer solution containing a perfluorinated polymer (step b);
   forming a polymer layer on the surface of the convex part and in the concave part of the polymer mold by spreading the polymer solution prepared in step b) on the polymer mold prepared in step a) (step c);
   transcribing the polymer layer formed on the surface of the convex part of the polymer mold by contacting the polymer mold having the polymer layer formed in step c) with the substrate (step d); and
   transcribing the polymer layer formed in the concave part of the polymer mold by contacting the polymer mold finished with step d) with a new substrate and pressing thereof (step e).

9. The method for fabricating nano material pattern according to claim 1, wherein the method to form the pattern in step 1) is composed of the following steps:
   preparing a polymer solution containing a perfluorinated polymer (step a);
   forming a perfluorinated polymer thin layer on a substrate by spreading the polymer solution prepared in step a) on top of the substrate (step b);
   layering the patterned mask on top of the perfluorinated polymer thin layer formed in step b), followed by UV-irradiation (step c); and
   eliminating the non-irradiated part in step c) by using a solvent (step d).

10. The method for fabricating nano material pattern according to claim 1, wherein the method to form the pattern in step 1) is composed of the following steps:
    preparing a polymer solution containing a perfluorinated polymer (step a);
    forming a perfluorinated polymer thin layer on top of the polymer mold by spreading the polymer solution prepared in step a) thereon (step b);
    layering the patterned mask on top of the perfluorinated polymer thin layer formed in step b), followed by UV-irradiation (step c);
    eliminating the non-irradiated part in step c) by using a solvent (step d); and
    transcribing the pattern formed in step d) on the polymer mold by contacting the pattern with a substrate (step e).

11. The method for fabricating nano material pattern according to claim 1, wherein the method to form the pattern of step 1) is selected from the group consisting of microcontact printing, photolithography, imprint method, inkjet printing, and dispensing.

12. The method for fabricating nano material pattern according to claim 1, wherein the perfluorinated polymer of step 1) is a homopolymer or a copolymer containing poly (perfluoroalkyl methacrylate) or poly(perfluoroalkyl acrylate).

13. The method for fabricating nano material pattern according to claim 1, wherein the substrate of step 1) is selected from the group consisting of silicone substrate, glass substrate, poly methyl methacrylate (PMMA) substrate, poly vinyl pirrolidone (PVP) substrate, polystyrene (PS) substrate, polycarbonate (PC) substrate, polyethersulfone (PES) substrate, cyclic olefin copolymer (COC) substrate, TAC (triacetylcellulose) substrate, polyvinyl alcohol substrate, polyimide (PI) substrate, polyethyleneterephthalate (PET) substrate, and polyethylenenaphthalate (PEN) substrate.

14. The method for fabricating nano material pattern according to claim 1, wherein the thickness of the pattern fabricated in step 1) is 50 nm~10 μm.

15. The method for fabricating nano material pattern according to claim 1, wherein the nano material of step 2) is one or more materials selected from the group consisting of metal nano wire, oxide nano wire, carbon nano tube, graphene, metal nano particle, and oxide nano particle.

16. A method for fabricating nano material pattern comprising the following steps:
   forming a perfluorinated polymer pattern on top of the substrate (step 1);
   spreading a dispersion containing the dispersed nano material and a functional material on the substrate patterned in step 1) (step 2); and
   eliminating the perfluorinated polymer pattern formed on the substrate of step 2) (step 3).

17. The method for fabricating nano material pattern according to claim 16, wherein the method for spreading the dispersion containing nano material dispersed therein and the functional material on the substrate in step 2) is one of the methods selected from the group consisting of the followings: the method comprising the steps of spreading the nano material dispersion first and then spreading the functional material, the method comprising the steps of spreading the functional material first and then spreading the nano material dispersion; and the method comprising the steps of spreading the functional material, spreading the nano material dispersion and then spreading the functional material thereon.

18. The method for fabricating nano material pattern according to claim 16, wherein the functional material of step 2) is one or more materials selected from the group consisting of metal oxides, conducting polymers, UV curable polymers, thermal curable polymers, and dielectric polymers.

19. The method for fabricating nano material pattern according to claim 1, wherein the elimination of the perfluorinated polymer pattern in step 3) is performed by using a fluoro solvent.

20. A method for fabricating nano material pattern comprising the following steps:
   forming a perfluorinated polymer pattern on top of the substrate (step 1);
   spreading a dispersion containing the dispersed nano material on the substrate patterned in step 1) (step 2)
   eliminating the perfluorinated polymer pattern formed on the substrate of step 2) (step 3); and
   inserting the nano material pattern formed by eliminating the perfluorinated polymer pattern in step 3 into the inside of the substrate (step 4).

21. The method for fabricating nano material pattern according to claim 20, wherein when the substrate of step 1) is an organic substrate, step 4) is accomplished by inserting the nano material pattern into the substrate by giving thermo-compression on top of the substrate having the nano material pattern thereon.

22. The method for fabricating nano material pattern according to claim 20, wherein when the substrate of step 1) is an inorganic substrate, step 4) is accomplished by inserting the nano material pattern into a new organic substrate by contacting the nano material pattern generated on the inorganic substrate with the new organic substrate and then being followed by thermo-compression.

* * * * *